United States Patent [19]
Mazdiyasni et al.

[11] Patent Number: 5,135,907
[45] Date of Patent: Aug. 4, 1992

[54] MANUFACTURE OF HIGH PURITY SUPERCONDUCTING CERAMIC

[75] Inventors: Khodabakhsh S. Mazdiyasni, Alpine, Calif.; Debra J. Treacy, West Dennis, Mass.; Barry W. McQuillan, San Diego; Frederick H. Elsner, Cardiff, both of Calif.

[73] Assignee: General Atomics, San Diego, Calif.

[21] Appl. No.: 278,664

[22] Filed: Dec. 1, 1988

Related U.S. Application Data

[63] Continuation-in-part of Ser. No. 42,465, Apr. 24, 1987, abandoned.

[51] Int. Cl.$^5$ .............................. C01B 33/12
[52] U.S. Cl. ...................... 505/1; 505/735; 505/738; 505/737; 423/593; 252/500; 252/518
[58] Field of Search .............. 505/1, 735, 738, 737; 423/593; 252/500, 518; 59/154

[56] References Cited

U.S. PATENT DOCUMENTS

| | | | |
|---|---|---|---|
| Re. 32,107 | 4/1986 | January | 501/32 |
| 3,757,412 | 9/1973 | Mazdiyasni et al. | 502/170 |
| 3,917,780 | 11/1975 | Mazdiyasni et al. | 264/67 |
| 4,543,341 | 9/1985 | Barringer et al. | 501/1 |
| 4,591,575 | 5/1986 | Okabayashi et al. | 501/135 |
| 4,636,378 | 1/1987 | Pastor et al. | 502/525 |
| 4,764,357 | 8/1988 | Sherif et al. | 505/1 |
| 4,842,366 | 6/1989 | Sawada et al. | 505/809 |
| 4,847,239 | 7/1989 | Piotrowski et al. | 505/801 |

OTHER PUBLICATIONS

Capon et al. "Upper Critical Fields And High Superconducting Transition Temperatures OF LaScSuO and LaBaCuO", Appl. Phys. Lett 50(9) Mar. 2, 1987 pp. 543-544.

Nonaka et al., Jap. JAP 27, L867 (1988) Ba-Y-Cu-O Thin Films Fabricated by Dip Coating Using Concentrated Mixed Alkoxide Solution.

Umeda et al., Advanced Ceramic Materials, 3, 520 (1988) Fabrication of $YBa_2Cu_3O_7$-Superconducting Fibers by the Sol-Gel Method.

Laine et al., Superconductor Symp., ACers Mtg, May 1988 Organometallic Precursors for the Fabrication of High $T_c$ Superconducting Fibers.

Primary Examiner—Olik Chaudhuri
Assistant Examiner—Robert M. Kunemund
Attorney, Agent, or Firm—Ginger R. Dreger

[57] ABSTRACT

A method for the manufacture of superconducting polycrystalline ceramic materials by the decomposition of a mixture of isopropoxides.

33 Claims, 4 Drawing Sheets

MANUFACTURE OF HIGH PURITY SUPERCONDUCTING CERAMIC

This is a continuing application under 35 U.S.C. 120/121 of U.S. Ser. No. 042,465 filed Apr. 24, 1987, now abandoned the contents of which being hereby expressly incorporated by reference.

This invention relates generally to the manufacture of complex superconducting ceramics. More specifically, it relates to a low temperature method for the manufacture of ultra high purity homogeneous polycrystalline ceramics that are high-temperature superconductors by hydrolytic decomposition of a mixture of metal alkoxides and thermal conversion of the obtained hydroxides into the desired superconducting oxides.

It has recently been reported that a class of ceramic materials has been discovered that exhibit superconductivity at temperatures substantially higher than the previously known superconductors. The superconducting ceramic materials are quaternary ceramics composed of yttrium or a lanthanide series rare earth metal, a transition metal such as barium or strontium, copper and oxygen. Initial reports indicated that these polycrystalline ceramics exhibit the onset of superconductivity at temperatures of 40°-50° K. Later reports indicate onset of superconductivity as high as 90° K. or above when the ceramics are placed under hydrostatic loading. The most promising results appear to be obtained in a yttrium, barium, copper oxygen system, in particular in a so-called "1,2,3" system, in which the yttrium/barium/copper ratio is about 1:2:3.

The mechanism by which these ceramic materials achieve superconductivity at surprisingly high temperatures is not fully understood. Their crystal structure has not been finally determined except to the extent that it is known that they are complex layered crystals whose configuration is sensitive to heat and pressure. It is assumed that the particular lattice structure is necessary for resistanceless flow below certain temperatures.

The reported superconducting ceramics have been prepared by thermal conversion of their inorganic salts, for example nitrate salts, or by solid state reaction of the carbonates and oxides at elevated temperatures, for example, 800°-1000° C. Reaction times of from several hours to days are required. Grinding to a fine particle size and additional roasting at elevated temperatures, with or without the presence of an oxygen rich atmosphere, is necessary to impart superconductivity at the higher temperatures reported. Because this class of ceramics decomposes with heat, the long reaction and processing times at elevated temperatures required to obtain the desired compounds and impart superconductivity necessarily result in wide composition variations in the end product which can greatly affect the temperature at which superconductivity onsets. Indeed, extended processing at elevated temperatures may destroy the ability of the ceramic to achieve superconductivity.

The purity of the quaternary ceramic obtained by thermal conversion of inorganic salts or by solid state reaction of carbonates and oxides is not as high as desired. Consequently, the homogeneity of the resulting polycrystalline ceramic is not satisfactory. Also, the ceramic product is produced in lump form which requires grinding prior to pressing and sintering. Grinding results in powders having an average particle size of, for example, from 100 to 40 $\mu$m. This particle size is larger than optimum and may lead to difficulties in pressing and sintering of the ceramic powders into desired shapes. Further, grinding tends to introduce undesired impurities which may affect superconductivity.

Additional difficulties are experienced when the preparation of fibers, wires or films is attempted for potential applications. The ceramic superconductors are brittle, which makes their fabrication in these forms difficult with mechanical processing.

It would be desirable to directly produce superconducting ceramics of ultra high purity (for example, above 99.9%) having extremely small particle sizes, for example between about 2 and 500 nm, so that additional grinding before further processing could be avoided. It would also be desirable to provide a low temperature method for the manufacture of superconducting ceramics which would permit more accurate control over the final composition of the ceramic, which, as indicated, may exhibit critical composition changes when exposed to high temperatures for extended periods. It would further be desirable to provide a flexible process which either yields the superconducting ceramics as extremely fine powders that can be further processed in the desired shape or, via their sols or gels, enables the direct production of a wide array of monoliths. As used herein, the term monolith means a discrete shape of the superconducting ceramic selected on the basis of its intended end use. A monolith may, for example, be a coated surface, a sheet or film, a molded or cast shape or fibers.

The hydrolytic decomposition of yttrium and lanthanide series rare earth metal alkoxides to form oxides has been known for a number of years. Similarly, polycrystalline lead lanthanum zirconate titanate quaternary bodies have been produced by cold pressing and sintering alkoxy derived powders. These methods are disclosed in U.S. Pat. Nos. 3,278,571, 3,757,412 and 3,917,780, the disclosures of which being specifically incorporated by reference.

The application of sol-gel techniques to the manufacture of glass and ceramics has also been known. The materials prepared by those prior art methods were well characterized piezo-, ferroelectric and/or electrooptic compounds with known chemical composition and crystal structure. The mechanism by which they exhibited the mentioned properties was considerably well understood. To optimize their performance, the cited publications focused on methods that provided these materials in the desired stoichiometry and high purity.

In the present attempt to prepare high-performance superconducting materials the present researchers faced a more complex problem. With so little knowledge of the mechanism of high-temperature superconductivity the present researchers had no means to predict whether the methods developed for the production of other ceramic oxides could be adapted to the manufacture of ceramic superconductors without any detrimental effect on their superconducting properties.

We found that hydrolytic decomposition of the alkoxides of their components provides a versatile, relatively simple, low temperature process for the manufacture of the desired superconducting ceramics whose stoichiometry is easily controlled within close tolerances. The process may be conducted so as to directly produce 99.9+% purity powders having an average particle size of 2-500 nm. Alternatively, the process may be conducted so as to provide a sol of the ceramic constituents which may be formed into a monolith having a desired shape, including fibers and films that are hard to manufacture by other methods. Alternatively, the sol may be converted to a gel which may be formed into a desired monolith. By changing the pH, a ceramic powder may be precipitated from the sol.

The process may be carried out at or near ambient temperature and pressure and requires minimal time. The product purity exceeds 99.9% as compared to purities achieved with prior processes. The powder obtained directly by the present process has a significantly smaller average particle size than can be obtained by grinding and thus has a vastly increased surface area and activity. Moreover, the avoidance of grinding contributes to the exceptionally high purity.

The ceramic superconducting materials which are manufactured in accordance with the disclosed method have the formula:

$$MM'_2Cu_3O_{6.5-8}$$

where M is selected from yttrium, the lanthanide rare earth metals, i.e., those having atomic numbers from 57 to 71 with the exception of 58, 59 and 61 and mixtures thereof. M' is selected from barium and strontium and mixtures thereof. It is contemplated that a portion of the copper may be replaced by nickel.

A preferred composition is $YBa_2Cu_3O_{6.5}$, and the present invention is described in conjunction with this ceramic composition. However, it is understood that the invention extends to the manufacture of all of the compounds delineated by the above formula.

In a preferred form of the invention, the raw materials are the isopropoxides of yttrium, barium and copper dissolved in an alcoholic solvent. The isopropoxides may be prepared in accordance with known reactions; such as:

$$Y + 3C_3H_7OH \xrightarrow{HgCl_2} Y(OC_3H_7)_3 + HCl + Hg$$

$$Ba + 2C_3H_7OH \xrightarrow{\Delta} Ba(OC_3H_7)_2 + H_2$$

$$Na + C_3H_7OH \xrightarrow{\Delta} NaOC_3H_7 + H_2$$

$$2NaOC_3H_7 + CuCl_2 \longrightarrow Cu(OC_3H_7)_2 + 2NaCl$$

Other alkali metals may be used in place of sodium.

It is to be understood that other alcohols may be substituted for isopropyl alcohol in the above reaction to provide the corresponding alkoxides. Examples of suitable alcohols include straight or branched chain saturated and unsaturated alcohols, e.g. methanol, ethanol, isopropanol; glycols, etc. of 1 to 6 carbon atoms; aryls and phenols; isoamyl alcohol and the like, that may be optionally substituted, for example, by one or more halogens, e.g. fluoride; amides, etc. Isopropyl alcohol is preferred.

The isopropoxides are dissolved in a suitable nonaqueous water miscible solvent in which each is soluble. The preferred solvent is isopropyl alcohol or, in a particular embodiment of the invention, ethanol amine or diethanol amine. The concentration of the isopropoxides is controlled in accordance with the composition desired in the ceramic end product. Since the preparation of the oxides from the isopropoxides does not entail extensive heating at elevated temperatures, close compositional control of the ceramic end product is easily achieved. Further, where subsequent processing is found to cause one or more ingredients to be degraded or lost due to decomposition, that loss may be readily compensated for by including an excess of that ingredient in the isopropoxide solution.

Care should be taken to ensure that the solution of isopropoxides is thoroughly mixed and is homogeneous. Mixing may be effected in any convenient manner such as by stirring, shaking and the like. A preferred form of mixing when employing an isopropyl alcohol solvent is to reflux the solution (82.4° C.) under agitation.

It is important that each of the alkoxides is completely dissolved, even in the concentrated solutions required for the preparation of fibers or films by the sol-gel technique. It has been found that in dilute solutions each of the yttrium, barium and copper isopropoxides completely dissolves in isopropyl alcohol in the presence of the other isopropoxides and the solubilized isopropoxides do not interfere with each other. It is contemplated that the copper isopropoxide may be replaced by the corresponding nitrate salt. When copper nitrate is used it may be dissolved in the water bath as discussed below.

In some instances difficulty in maintaining the alkoxides in solution was experienced in preparing more concentrated solutions, particularly when alkoxides prepared with different alcohols were used as starting compounds since copper alkoxides tended to precipitate from the alkoxide mixture, probably due to alcohol exchange reactions. This problem was encountered, e.g. when a mixture of copper bis methoxide ($Cu(OCH_3)_2$), barium bis ethoxide ($Ba(OC_2H_5)_2$) and yttrium tris isopropoxide ($Y(i-OC_3H_7)_3$) was employed.

It was discovered that by complexing the copper alkoxide with an organic nitrogen base, such as a straight or branched chain, saturated or unsaturated aliphatic primary or secondary amine, having from 2 to 6, preferably 2 to 4, most preferably 2 carbon atoms, e.g. ethanolamine or diethanolamine and admixing the complex with the M and M' alkoxide solutions, the precipitation of copper alkoxide can be avoided even at high concentrations. It is also contemplated to utilize aromatic amines, such as pyridine or pyridine derivatives. Any organic amine capable of complexing with copper, yielding complexes that can be decomposed by hydrolysis is suitable for practicing the present invention. The selection of the best suited amine for complexing the copper alkoxide in a given reaction system is well within the knowledge of those with ordinary skill in the art.

The reaction of the amine compound with the copper alkoxide results in the formation of a complex that is substantially entirely soluble in the solutions obtained by admixing the complex with solutions of M and M' alkoxides in alcohols and/or in organic amines, preferably in the amine compound used for preparing the copper complex. If an amine compound is employed as a solvent, some complexation between M and/or M' and the amine compound may also take place; this has, however, no observable effect on the subsequent steps, i.e.

hydrolytic decomposition of the alkoxide compounds and subsequent heat treatment. The complexing reaction is preferably carried out in dry, carbon dioxide-free atmosphere, with exclusion of atmospheric moisture, at slightly elevated temperatures. Higher temperatures that might lead to the decomposition of the copper-amine complex, should be avoided. We have experimentally found that when ethanolamine is used as an amine component, temperatures not exceeding about 85° C. are safe. For other amines the temperature limits may be different but the selection of the appropriate temperature is well within the knowledge of those with ordinary skill in the pertinent art.

A similar method was published by Nonaka et al., Japanese Journal of Applied Physics 27, 5, L867 (1988). The authors prepared highly concentrated mixed alkoxide solutions using ethanol as a solvent, in the presence of diethanolamine. Superconducting oxide layers were then manufactured by dip coating and pyrolysis. According to the article, any hydrolytic reaction of the alkoxides is strongly suppressed by the addition of diethanolamine.

According to the present invention, the yttrium, barium and copper alkoxides, after their solutions have been prepared, are hydrolytically decomposed by controlled hydrolysis.

According to one embodiment of the process, carried out without complexing of the copper alkoxide with an amine, the alcoholic solution of isopropoxides is introduced into an excess of water. The volume ratio of the isopropyl alcohol solution to water may vary from 1:1 to 1:10. The isopropoxides spontaneously decompose to the corresponding hydroxides at or near room temperature. To avoid introducing (deleterious) impurities into the ceramic end product, the water is preferably triple distilled $CO_2$ free and deionized. For a person skilled in the art of high-temperature superconductors it is obvious that any impurity that results in the deterioration of superconducting properties is "deleterious" and hence, should be avoided. Typical "deleterious" impurities are metallic or non-metallic trace elements, other than the constituents of the superconducting ceramic (Ba, M, M'), such as iron, chromium, phosphorus, silicon, aluminum, tungsten, sodium, etc. Hydrolysis is carried out with water substantially free of such "deleterious" impurities. By the term "substantially" we mean that water is purified from these impurities within practicable limits, at least to the extent that they do not interfere materially with the high-temperature superconducting properties of the final product. Triple distilled deionized water is preferred.

If it is desired to proceed directly to a powder without utilizing sol-gel processing techniques, the pH of the water bath is maintained above about 7, preferably between about 7.5 and 9, by the addition of a suitable base, for example, ammonium hydroxide or ammonia. The yttrium barium copper complex hydroxides precipitate immediately and are recovered by evaporative drying, for example, by distillation, with or without a vacuum, freeze drying, etc. Filtration is undesirable due to the potential loss of solubilized ions and a resultant change in stoichiometry. When copper nitrate is utilized as the source of copper, it complexes with or coats the hydroxide precipitate.

The recovered hydroxide complex is then washed e.g. with dry isopropyl alcohol and dried, for example, by heating at 50° C. under a vacuum of $1 \times 10^{-2}$ to $10^{-3}$ microns yielding a light bluish white hydrated yttrium barium copper powder. The powder is then calcined at a temperature of between about 300° C. and about 600° C. for a period of between about 15 minutes and about 60 minutes, preferably at a temperature of between about 400° C. and about 500° C. for a period of between about 20 minutes and about 30 minutes. Calcination causes the powder to blacken indicating that the complex of yttrium, barium and copper had been converted to the crystalline oxide form.

Chemical analysis of the calcined powder reveals that the stoichiometry of the calcined powder is substantially that of the mixture of isopropoxides. Due to the low temperature conditions utilized in the process, little or none of the yttrium, barium and copper is lost during processing. This is of significant advantage as compared to processes that require high temperatures since it permits precise control of the ratios of the constituents which is critical in order to achieve superconductivity.

Other advantages of the process are the extreme purity of the calcined powder which routinely exceeds 99.9% and the exceedingly small average particle size of between about 2 and about 500 nm that is obtained without the necessity of grinding. The high purity and small particle size of the calcined powder facilitates fabrication of the powder into highly densified shapes utilizing conventional ceramic powder processing techniques.

In order to impart superconducting properties to the calcined powder, it is necessary to roast or fire the powder at an elevated temperature of between about 800° C. and about 1100° C. for a period of between about 1 hour and about 5 hours. The firing of the calcined powder may be part of the powder fabricating process, e.g., pressing and sintering of the powder into a desired shape. Alternatively, the powder may be fired in powder form and thereafter pressed, plasma sprayed and injection mold or otherwise transformed into a superconducting monolith.

In accordance with conventional ceramic processing techniques, the calcining and roasting steps may be combined. For example, the powder or monolith may be slowly heated to the desired temperature over time, the volatiles being evolved during the initial stages of the heating process.

The calcined powder is particularly amenable to conventional sintering techniques. The powder may be cold pressed at or near room temperature in conventional steel dies at a pressure between about 1 ksi and about 25 ksi, preferably between about 5 ksi and about 10 ksi, to form greenware which may then be fired in accordance with the conditions set forth herein. The firing may be carried out at atmospheric pressure or in an oxygen rich atmosphere at an elevated pressure of, for example, 1 to 5 atmospheres.

As discussed herein, a significant advantage of the present invention is the wide latitude of monoliths of superconducting ceramics that may be prepared. When a superconducting body or film other than one conveniently prepared by powder processing techniques is desired, the concentrated alkoxide solutions prepared by complexing of the copper alkoxide compound with an organic amine may be conveniently used. The concentration of these concentrated solutions generally is between about 0.01 and about 0.1M alkoxide. The most concentrated solutions that can be directly prepared by this method are about 0.1M. In order to avoid undesired dilution of the concentrated alkoxide solutions, in this embodiment of the invention hydrolysis is carried out with a calculated amount of water, that is the stoichiometric equivalent of the alkoxide groups to be hydrolysed or a slight excess thereover. The solutions of the hydroxides can be further concentrated by known techniques, e.g. evaporation to sols from which e.g. fibers can be prepared. Alternatively, they can be diluted if desired, to enable the preparation of other monoliths, such as very thin films. The adjustment of the concentration and viscosity to a value that is optimal for the intended use is within the knowledge of a person with ordinary skill in the art.

Alternatively, sols/gels may be prepared from the more dilute solutions obtained without complexing the copper component. In such instances, the pH of the water into which the mixtures of isopropoxides is introduced is adjusted to below 7, preferably to between about 2 and about 5, by the addition of any suitable electrolyte. A preferred electrolyte is nitric acid, although other mineral or organic acids may be employed provided they do not contaminate the superconducting ceramic product.

The hydroxides that are formed upon hydrolytic decomposition of the isopropoxides are soluble in the acidic water and a homogeneous sol is formed.

The sol may be converted to a gel in accordance with known techniques by concentrating the sol until a gel of desired viscosity and/or thixotropic properties is obtained. The gel may be converted back to a sol by dilution with water or a mixture of water and isopropyl alcohol. A complex mixture of hydroxides may be precipitated from the sol by raising the pH to above 7, preferably to between about 8 and about 9, by the addition of a suitable base as described herein.

The flexible processing conditions provided by the present invention permit the preparation of diverse monoliths of the superconducting ceramic. Transformation of the hydrolytically decomposed isopropoxides to a sol-gel offers the opportunity to create an almost endless variety of superconducting monoliths. A sol of the solubilized hydroxides may be applied as a coating or film by dipping or spraying an appropriate substrate with one or with a multiple of thin coatings of the sol, which may then be dried and fired as described herein. The substrate may be retained after firing to provide structural support and crystallographic orientations or may be stripped from the superconducting monolith, as may be desired.

A sol of the solubilized hydroxides may be spun into fibers by spinning the sol into a medium, for example, an aqueous solution having a pH of eight to nine using conventional fiber spinning techniques. The fibers are then dried and fired to provide superconducting fibers.

Superconducting films and coatings may likewise be prepared from gels of appropriate rheology. In some instances the ability to apply thicker coatings from gels may be desirable.

Superconducting coatings and films may also be prepared from the powdered form of ceramic using conventional plasma spraying, sputtering, electron beam vaporization and other coating processes used to apply ceramic coatings.

It is also contemplated to utilize the ceramic powders to form coaxial superconducting wires having a central core or rod and an outer cladding surrounding an annulus filled with the superconducting powder. The coaxial wire may then be drawn or swaged to compress and densify the superconducting powder. The core and cladding material are selected to provide desired strength and expansion characteristics. For example, the core and cladding materials may have different coefficients of expansion such that the superconducting powder is placed under compression at superconducting temperatures.

It is also contemplated to coat the surface of a flexible tape with the superconducting ceramic material which may then be wound around an appropriate core or mandrel. It is further contemplated to prepare hollow superconducting fiber or wire by coating the surface of a combustible thread or wire and thereafter burning out the thread leaving the hollow superconducting thread.

A gel of the complex of hydroxides is particularly suitable for preparing monoliths of intricate shape. A gel may be injection molded, rotary molded, slip cast, or hot or cold isostatically pressed into a shape designed for a particular application. Generally, any fabrication techniques used in the manufacture of ceramics may be employed. Electrophoresis deposits form the sol is also contemplated. The monolith may then be dried and roasted to provide a superconducting body precisely tailored to fit a particular end use application.

EXAMPLE I

Ten grams of a superconductor precursor powder with nominal yttrium, barium and copper oxide molar ratios of $YBa_2Cu_3O_{6.5}$ is prepared by adding yttrium tris isopropoxide (0.01519 moles), barium bis isopropoxide (0.03039 moles) and copper bis isopropoxide (0.04558 moles) to 500 ml of isopropyl alcohol. The solution of metal isopropoxides is refluxed for a period of one hour to provide a homogeneous solution. The solution mixture of metal isopropoxides is added dropwise to an excess of triply distilled deionized water (about five moles) thereby hydrolytically decomposing the alkoxides and forming a complex mixture of hydroxides.

The hydroxide is recovered by rotavapor distillation, washed several times with dry isopropyl alcohol and dried under a vacuum at 50° C., yielding approximately ten grams of a bluish white powder.

EXAMPLE II

Ten grams of a superconductor precursor powder with a nominal lanthanum, barium and copper oxide molar ratios of $La_{1.85}Ba_{0.15}Cu_{3.925}$ is prepared following the procedure of Example I from a solution of lanthanum tris isopropoxide (0.0458 moles), barium bis isopropoxide (0.0037 moles) and copper bis isopropoxide (0.02476 moles) in 500 ml isopropyl alcohol.

EXAMPLE III

Ten grams of superconductor precursor powder having a nominal composition of yttrium, barium and copper oxide molar ratios of $YBa_2Cu_3O_{6.5}$ was prepared by adding yttrium tris isopropoxide (0.01519 moles) and barium bis isopropoxide (0.03039 moles) to 500 ml of isopropyl alcohol. The isopropoxide solution was refluxed for one hour to provide a homogeneous solution and then was added dropwise to five moles of triply distilled deionized water containing 0.045578 moles $Cu(NO_3)_2 \cdot 3H_2O$. The isopropoxides hydrolytically decompose and a complex of yttrium hydroxide-barium hydroxide-copper nitrate is formed.

The complex is recovered by rotavapor distillation and washed with dry isopropyl alcohol and dried under vacuum at 50° C. yielding ten grams of bluish white powder.

EXAMPLE IV

Samples of the powders of Examples I, II and III were calcined at 600° C. for 30 minutes to black superconductor powders. The chemical analysis of the powder indicated nominal composition is maintained and a purity of 99.9+% is obtained. specimens ⅜" in diameter and ⅛" thick are uniaxially cold pressed at room temperature in a steel due at 25 ksi. The compacted powders are sintered in static air at 900° C. for 3 hours to high density superconductor bodies. Wet chemical analysis of the superconductor ceramic with an accuracy of ±1% for yttrium, lanthanum, barium and copper is performed. The analysis agreed well with the nominal composition. The onset of superconductivity for the specimens prepared from the powders of Examples I and III is 94.7° K. and the resistance reached zero at 85° K. The onset of superconductivity for the specimens prepared from the powder of Example II is 45° K. and the resistance reached zero at 37° K.

Figure 1:
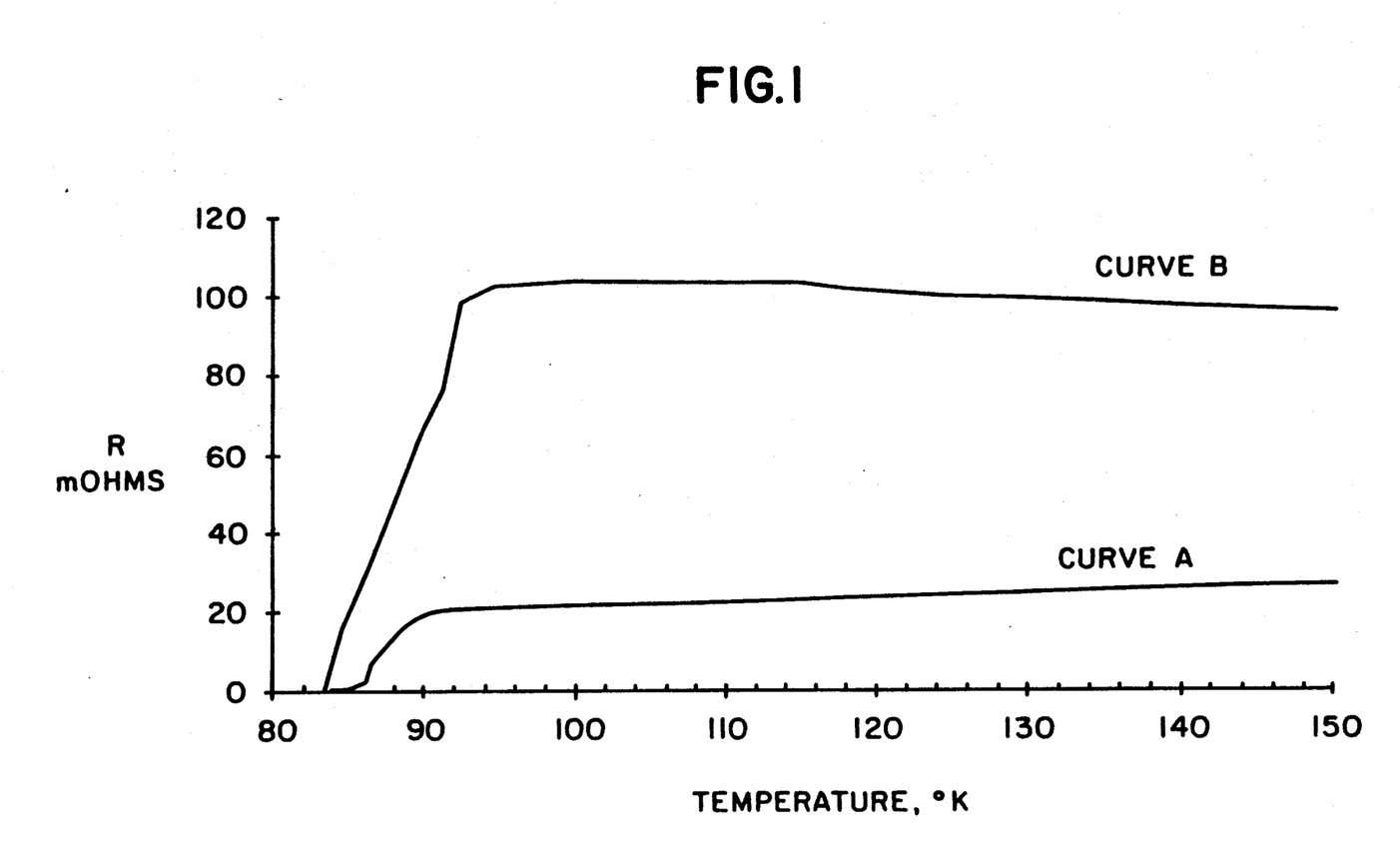
FIG. 1 is a graph of temperature (in K.) versus resistance for a ceramic made by thermal conversion (Curve A) and a ceramic made in accordance with the present invention (Curve B).

FIG. 1 is a graph of temperature versus resistance for superconductor bodies prepared from the powder of Example III as described in Example IV (Curve B) as compared to a superconducting ceramic of substantially identical nominal composition prepared by the prior art process of thermal conversion of the nitrate salts of yttrium, barium and copper (Curve A).

As indicated, it is contemplated that a portion of the copper content of the superconducting ceramic may be replaced by nickel. Particularly desirable nickel containing ceramics are those defined by the formula $YBa_2Cu_{3-x}Ni_xO_7$, with x varying from a trace, e.g., 0.01 up to about 2. The nickel containing ceramic may be prepared from the isopropoxide in accordance with the disclosed method. The nickel may also be added to the water bath in the form of nickel nitrate which complexes with the hydroxides formed by the hydrolytic decomposition of the isopropoxides. An example of a nickel containing superconductor is set forth in the following Example VI. Nickel can be introduced into the more concentrated solutions prepared by complexing the copper alkoxide with an organic amine, in an analogous manner.

EXAMPLE V

A solution of dissolved isopropoxides in the molar ratio of $YBa_2Cu_3O_{6.5}$ is prepared in accordance with Example I and refluxed for one hour. The solution is added dropwise to five moles of triply distilled deionized water heated to 75° C. causing hydrolytic decomposition of the isopropoxides to a complex hydroxide precipitate.

A clear sol of solubilized hydroxides is prepared by adjusting the pH to 2-3 by the addition of nitric acid. Upon aging at 30° C. for 24 hours, the sol is converted to a gel.

EXAMPLE VI

A run was conducted in which superconductor powder with a nominal yttrium, barium, copper and nickel oxide molar ratios of $YBa_2Cu_2NiO_{6.5}$ was prepared. Initially, on the basis of ten grams of powder, a solution of isopropoxides is prepared by adding yttrium tris isopropoxide (0.01519 moles) and barium bis isopropoxide (0.03039 moles) to 500 ml isopropyl alcohol. The solution of isopropoxides is refluxed for a period of one hour and is added dropwise to about five moles of triply distilled deionized water containing 0.03062 moles of copper nitrate, $Cu(NO_3)_2.3H_2O$ and 0.1531 moles of nickel nitrate, $Ni(NO_3)_2.3H_2O$, thereby hydrolytically decomposing the alkoxides and forming a complex of hydroxides and nitrates.

The complex is recovered by rotavapor distillation and washed several times with dry isopropyl alcohol. The washed product is dried under a vacuum at 50° C., yielding a bluish green powder which is calcined for three hours at 400° C. in flowing oxygen. The powder is ground and heated at 600° C. in flowing oxygen for an additional four hours.

Figure 2:
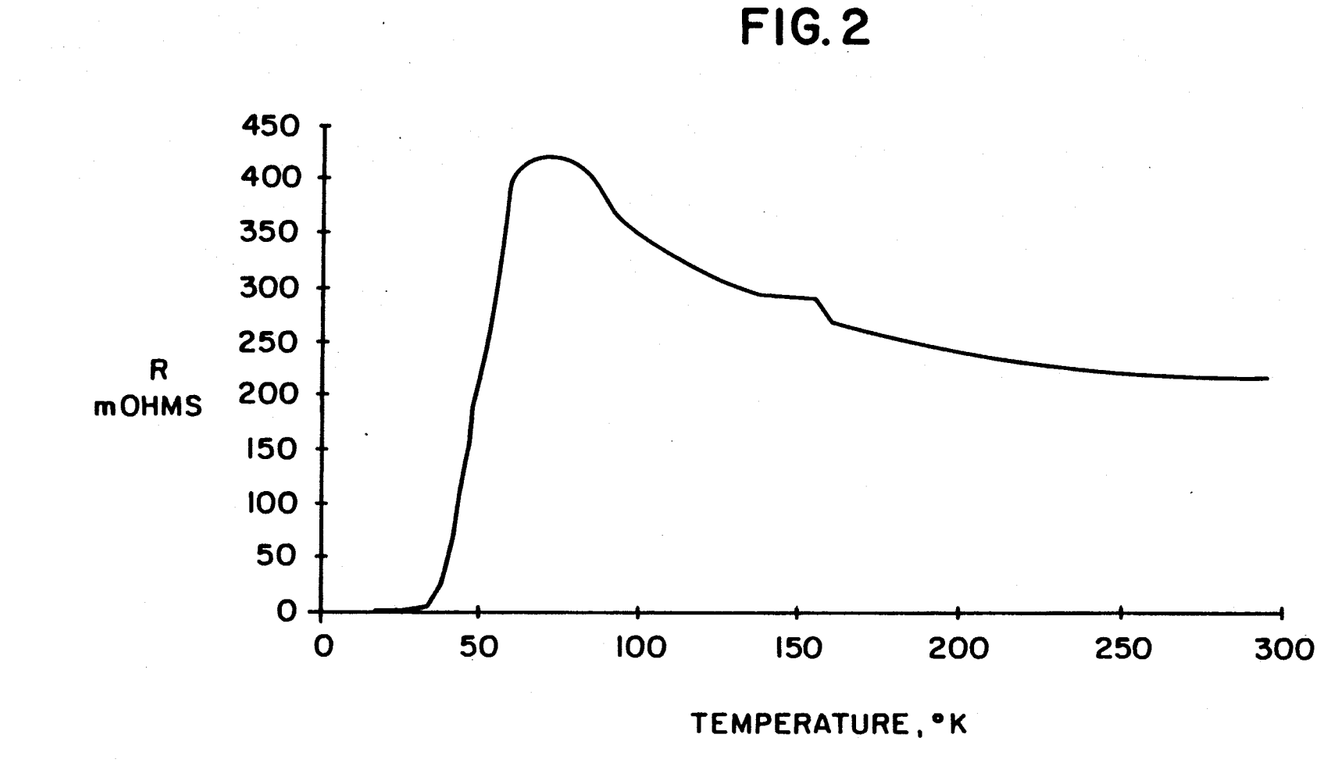
FIG. 2 is a similar graph for another ceramic.
Figure 3A:
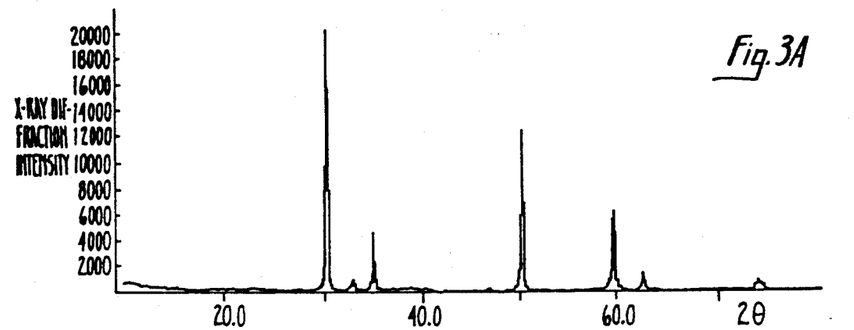
FIGS. 3A and 3B are x-ray diffraction patterns for a ceramic prepared according to Example VII and its substrate.
Figure 3B:
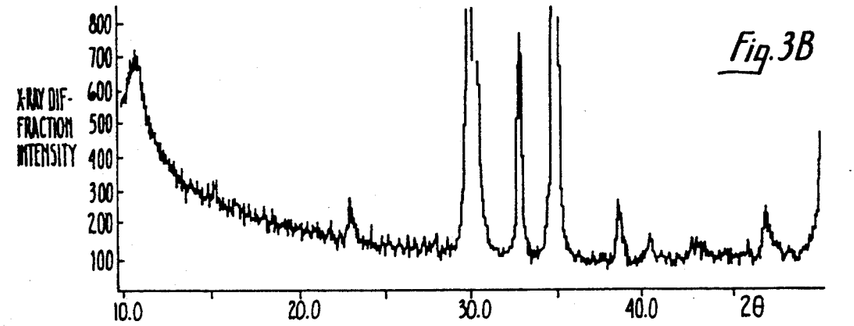
Figure 3C:
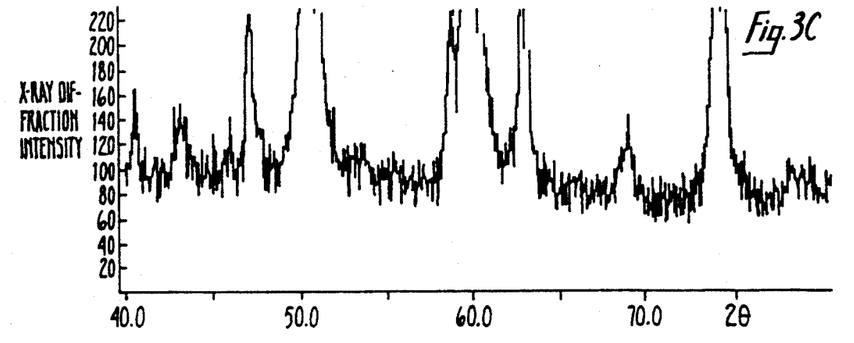
Figure 3D:
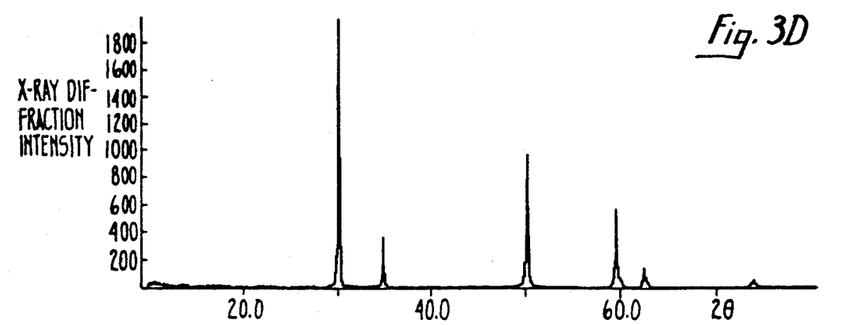
Figure 3E:
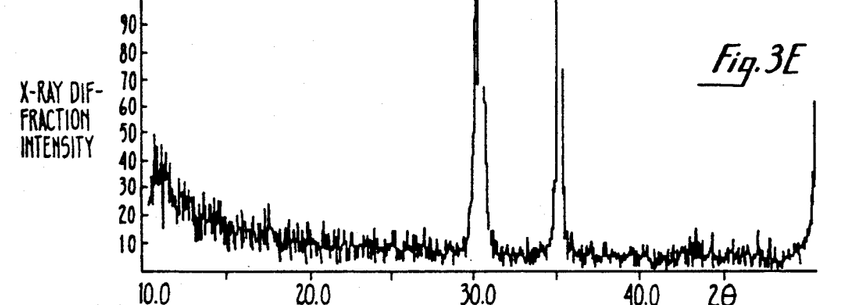
Figure 3F:
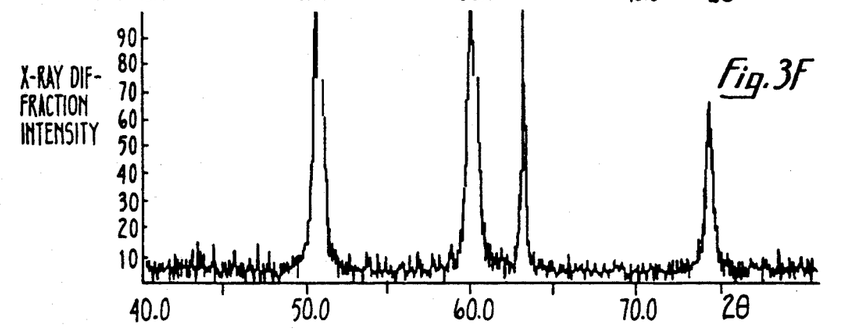

The powder is reground and pressed into a pellet at 25 ksi. The pellet is fired at 700° C. for two and a half hours in flowing oxygen and cooled in air. The pellet shows an onset of superconductivity at 64° K. The plot of temperature versus resistance is illustrated in FIG. 2.

It has been discovered that many of the disclosed ceramics have desirable semiconductor properties at room temperature. This is particularly true of those ceramics that are roasted at the lower roasting temperatures for relatively short times.

EXAMPLE VII 0.500 g (0.00398 moles) of copper bis methoxide ($Cu(OCH_3)_2$) were admixed with 30 ml of ethanolamine under stirring and exclusion of carbon dioxide and atmospheric moisture. The mixture was placed in a water bath of 67° C. to 72° C. and was kept at this temperature for one hour 15 minutes. The reaction mixture was allowed to cool to room temperature whereupon 3 drops of triply distilled deionized water ($\geq 1$ equivalent $H_2O$/alkoxide) were added and the mixture was stirred for one hour.

0.369 g (0.00269 moles) of barium were reacted with 30 ml of dry ethanolamine until no metal was left.

The barium ethanolamine solution was added to the previously prepared copper solution.

In a separate flask 3 ml (0.436 moles) of yttrium tris isopropoxide solution in isopropanol was reacted with excess ethanol. The obtained solution was admixed with the previous solution and the resultant mixture was stirred at room temperature for one hour. The obtained deep purple solution was stirred in a 70° C. water bath for 0.5 hours. A clear deep green solution was obtained that was concentrated in vacuum at 66° C. to reduce the original, about 100 ml volume to about 15 ml. Further dilution with ethanol resulted in a 0.002M solution of the hydroxides of the desired 1,2,3 superconductor compound (light brown color).

Three drops of the obtained solution were put on yttrium stabilized zirconia substrate and the coating was treated at 875° C. for 15 minutes, in air. A thin, homogenous looking film was obtained that, according to x-ray diffraction analysis (FIG. 3) was the right orthorombic $YBa_2Cu_3O_{6.5}$ (1,2,3) phase.

We claim:

1. A method for the manufacture of a ceramic powder that exhibits superconducting properties when cooled to an appropriate temperature between about 90° K. and about 40° K., said ceramic having the formula $MM'_2Cu_3O_{6.5-8}$, where M is yttrium, a member of the lanthanide rare earth metal series, or mixtures thereof and M' is selected from barium, strontium and mixtures thereof and where up to about two thirds of Cu may be replaced by Ni, and having an average particle size of between about 2 and about 500 nm and a purity in excess of 99.9% comprising:

a) preparing a homogeneous solution of the alkoxides of M, M' and Cu in an alcohol solvent, the molar concentrations of said alkoxides being selected to provide the desired ceramic stoichiometry;

b) hydrolytically decomposing said alkoxides by controlled hydrolysis with triply distilled deionized water at a pH above about 7 thereby forming a particulate precipitate of the hydroxides of M, M' and Cu having a particle size of between about 2 and about 500 nm;

c) separating the hydroxide precipitate;

d) calcining the hydroxide precipitate at a temperature of between about 300° C. and about 600° C. for a period of between about 15 and about 60 minutes to remove volatiles and to convert the hydroxides to oxides; and e) roasting the calcined oxides at a temperature of between about 800° C. and about 1100° C. for a period of between about 1 and about 5 hours.

2. The method of claim 1 wherein the alcohol is isopropyl alcohol.

3. The method of claim 1 wherein the hydrolytic decomposition is carried out at or near room temperature.

4. The method of claim 1 wherein the oxides are roasted in the presence of oxygen.

5. The method of any one of claims 1 to 4 wherein the ceramic has the formula $YBa_2Cu_3O_{6.5-8}$.

6. The method of any one of claims 1 to 4 wherein the ceramic has the formula $YBa_2Cu_3O_{6.5}$.

7. The method of claim 1 wherein the particulate oxides are pressed into a discrete shape prior to roasting.

8. A method for the manufacture of a ceramic monolith that exhibits superconducting properties when cooled to an appropriate temperature between about 90° K. and about 40° K., said ceramic having the formula $MM'_2Cu_3O_{6.5-8}$, where M is yttrium, a member of the lanthanide rare earth metal series, or mixture thereof and M' is selected from barium, strontium and mixtures thereof and where up to about two thirds of Cu may be replaced by Ni comprising:

a) preparing a homogeneous solution of the alkoxides of M, M' and Cu in an alcohol solvent, the molar concentrations of said akloxides being selected to provide the desired ceramic stoichiometry;

b) hydrolytically decomposing said alkoxides by controlled hydrolysis with triply distilled deionized water at a pH of less than about 7 forming a sol of the hydroxides of M, M' and Cu;

c) forming the sol into a monolith;

d) calcining the monolith at a temperature of between about 300° C. and about 600° C. for a period of between about 15 and about 60 minutes to remove volatiles and to convert the hydroxides to oxides; and e) roasting the calcined oxides at a temperature of between about 800° C. and about 1100° C. for a period of between about 1 to about 5 hours.

9. The method of claim 8 wherein the alcohol is isopropyl alcohol.

10. The method of claim 8 wherein the hydrolytic decomposition is carried out at or near room temperature.

11. The method of claim 8 wherein the calcined monolith is roasted in the presence of oxygen.

12. The method of any one of claims 8 to 11 wherein the ceramic has the formula $YBa_2Cu_3O_{6.5-8}$.

13. The method of any one of claims 8 to 11 wherein the ceramic has the formula $YBa_2Cu_3O_{6.5}$.

14. The method of claim 8 wherein the monolith is fibers spun from the sol.

15. The method of claim 8 wherein the monolith is a substrate coated with one or more layers of the sol.

16. The method of claim 8 wherein the sol is converted to a gel prior to formation of the monolith.

17. The method of claim 16 wherein the monolith is formed by molding or casting the gel.

18. A method for the manufacture of homogenous solutions of M, M' and Cu alkoxides, wherein M is yttrium, a member of the lanthanide rare earth metal series, or mixtures thereof, M' is selected from barium, strontium and mixtures thereof and where a portion of Cu may be replaced by Ni, comprising:

a) reacting a Cu alkoxide with an organic amine, and b) admixing the obtained complex with solutions of M and M' alkoxides in a solvent selected from the group consisting of alcohols, organic amines and mixtures thereof.

19. The method of claim 18 wherein said organic amine reacted with said Cu alkoxide is a primary or secondary aliphatic amine.

20. The method of claim 19 wherein said aliphatic amine is an alkanolamine.

21. The method of claim 20 wherein said alkanolamine is ethanolamine or diethanolamine.

22. The method of claim 18 wherein at least one of said M and M' alkoxides is dissolved in an alcohol.

23. The method of claim 18 wherein at least one of said M and M' alkoxides is dissolved in an organic amine identical with the amine reacted with said copper alkoxide.

24. The method of claim 23 wherein said organic amine is ethanol amine.

25. The method of claim 18 wherein said alkoxides of M, M' and Cu are formed with different alcohols.

26. The method of claim 25 wherein copper bis methoxide, barium bis ethoxide and yttrium tris isopropoxide are employed as alkoxides.

27. The method of claim 18 wherein the molar concentrations of said M, M' and Cu alkoxides are selected to provide the stoichiometry $M,M'_2Cu_3O_{6.5-8}$.

28. The method of claim 18 wherein the concentration of said homogenous alkoxide solution is up to about 0.1M alkoxide.

29. The method of claim 28 wherein said homogenous solution is further manufactured into a ceramic monolith that exhibits superconducting properties when cooled to an appropriate temperature between about 90° K. and about 40° K., said ceramic having the formula $M,M'_2Cu_3O_{6.5-8}$ wherein M and M' are as defined in claim 18, comprising:

a) hydrolytically decomposing said alkoxides by controlled hydrolysis with a calculated amount of water substantially free of deleterious impurities, thereby forming a solution of the hydroxides of M, M' and Cu;

b) forming the solution into a monolith;

c) treating the monolith at a temperature of between about 300° C. and about 1100° C. for a period of between about 15 minutes and about 6 hours to remove volatiles and to convert the hydroxides to oxides exhibiting said superconducting properties.

30. The method of claim 29 wherein step c) is carried out in two steps, comprising:

first, calcining the monolith at a temperature of between about 300° C. and about 600° C. for a period of between about 15 and about 60 minutes to remove volatiles and to convert hydroxides to oxides; and second, roasting the monolith at a temperature of between about 800° C. and about 1100° C. for a period of between about 1 and about 5 hours.

31. The method of claim 30 further comprising the step of adjusting the viscosity of said hydroxide solution obtained in step a) to a value suitable for the preparation of said ceramic monolith.

32. The method of claim 31 wherein said monolith is a fiber and said hydroxide solution is concentrated to form a sol of the hydroxides prior to carrying out steps b) and c) of claim 29.

33. The method of claim 30 wherein said monolith is a thin film and said hydroxide solution is diluted prior to carrying out steps b) and c) of claim 29.

* * * * *